(12) United States Patent
Eppes et al.

(10) Patent No.: US 6,815,965 B1
(45) Date of Patent: Nov. 9, 2004

(54) INTEGRATED CIRCUIT INTERNAL HEATING SYSTEM AND METHOD THEREFOR

(75) Inventors: David Eppes, Austin, TX (US); Thomas J. McKeone, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 327 days.

(21) Appl. No.: 09/585,921

(22) Filed: Jun. 2, 2000

(51) Int. Cl.[7] .............................................. G01R 31/26
(52) U.S. Cl. ................................. 324/760; 324/158.1
(58) Field of Search ................................. 324/760, 765, 324/754, 158.1, 763; 713/300, 310, 320, 321, 324; 219/209; 702/130; 438/14–19, 10, 11

(56) References Cited

U.S. PATENT DOCUMENTS

| | | | | |
|---|---|---|---|---|
| 5,309,090 A | * | 5/1994 | Lipp ........................ 324/158.1 |
| 6,037,793 A | * | 3/2000 | Miyazawa et al. .......... 324/760 |
| 6,046,433 A | * | 4/2000 | Gross et al. ................ 219/209 |
| 6,111,421 A | * | 8/2000 | Takahashi et al. .......... 324/758 |
| 6,163,161 A | * | 12/2000 | Neeb .......................... 324/760 |
| 6,235,543 B1 | * | 5/2001 | Kiyama .......................... 438/5 |
| 6,255,124 B1 | * | 7/2001 | Birdsley ...................... 438/14 |
| 6,265,888 B1 | * | 7/2001 | Hsu ............................ 324/760 |
| 6,281,029 B1 | * | 8/2001 | Goruganthu et al. .......... 438/18 |

* cited by examiner

*Primary Examiner*—Kamand Cuneo
*Assistant Examiner*—Jimmy Nguyen

(57) ABSTRACT

Substrate removal for analysis of a semiconductor die is enhanced via a method and system for heating the die. According to an example embodiment of the present invention, a plurality of heating elements are formed in a semiconductor die. The die is operated while at least one of the plurality of heating elements heats a portion of the die adjacent the heating element. A response to the heating is detected and used to analyze the die. The present invention makes possible selective heating of the die in a manner that is readily controllable and implemented. Die analysis, including, for example, critical timing path analysis, is enhanced by this ability to controllably heat the die.

31 Claims, 2 Drawing Sheets

INTEGRATED CIRCUIT INTERNAL HEATING SYSTEM AND METHOD THEREFOR

RELATED PATENT DOCUMENTS

This application is related to and fully incorporates U.S. patent application Ser. No. 09/586,192, entitled "Heating System and Method Therefor," and filed concurrently herewith.

FIELD OF THE INVENTION

The present invention relates generally to semiconductor analysis and, more particularly, to semiconductor analysis involving heating a semiconductor die.

BACKGROUND OF THE INVENTION

The electronics industry continues to rely upon advances in semiconductor technology, including integrated circuits (ICs), to realize higher-functioning devices in more compact areas. For many applications, realizing higher-functioning devices requires integrating a large number of electronic devices into a single silicon die. In addition, many of the individual devices within the die are being manufactured with smaller physical dimensions. As the number of electronic devices per given area of the silicon die increases, and as the size of the individual devices decreases, testing processes become more important and more difficult.

Many integrated circuit dice include circuits having random defects. These defects can recover or fail under particular operating conditions and at higher temperatures. In addition, design faults can be sensitive to such particular operating conditions. Traditionally, isolation of IC faults has been attempted by operating the die in a manner that causes a failure to occur and by attempting to attribute the failure to a malfunctioning circuit element in the IC. One manner in which this has been performed is to operate the die at full speed while applying external heat to the die. Such electrical testing, however, does not always assist in fault isolation because many failure symptoms can manifest themselves in different ways, and malfunctions can result from a variety of different types of defects including defects at non-suspect circuitry locations.

One such testing application that has traditionally been very difficult to accomplish includes physical diagnosis of failing circuit paths in a semiconductor die. Identifying these "critical circuit paths" has been attempted using simulation in conjunction with a thorough understanding of semiconductor die design, followed by verification using physical probing of a suspect circuit. This physical analysis is difficult, however, because it generally requires intimate knowledge of the die design and is particularly difficult for use in analyzing a flip-chip type integrated circuit die. The identification and analysis of critical circuit paths continues to present a challenge to the advancement of the semiconductor industry.

SUMMARY OF THE INVENTION

The present invention is directed to a method and system for analyzing a semiconductor die involving the selective application of heat to the die using a heating grid. The present invention is exemplified in a number of implementations and applications, some of which are summarized below.

According to an example embodiment, the present invention is directed to a method for manufacturing and analyzing a semiconductor die using a particular application of heat. A plurality of heating elements are formed in a semiconductor die. At least one such heating element (such as an activatable semiconductor arrangement) is selectively caused to generate heat while the die is operating. The generated heat is used to heat one or more portions of the die, and a response, such as a failed operation, is detected in connection with analysis of the die. This enhances the ability to identify defects, design flaws, and critical circuit paths including, for example, critical timing circuit paths of the semiconductor die; and can be performed without necessarily using expensive laboratory test equipment. In addition, this method does not necessarily require operating the die at a known failing condition or under precisely controlled ambient temperature and voltage conditions.

According to another example embodiment of the present invention, a system is adapted to selectively heat a semiconductor die having a plurality of heating elements formed therein and to analyze the die in response to the selective heating. The system includes a controller adapted to selectively cause at least one of the heating elements to heat at least one adjacent portion of the die. A testing device is adapted to operate the die while heat is being applied, and a detector is adapted to detect a response from the die, the response being related to the operation and heat application.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
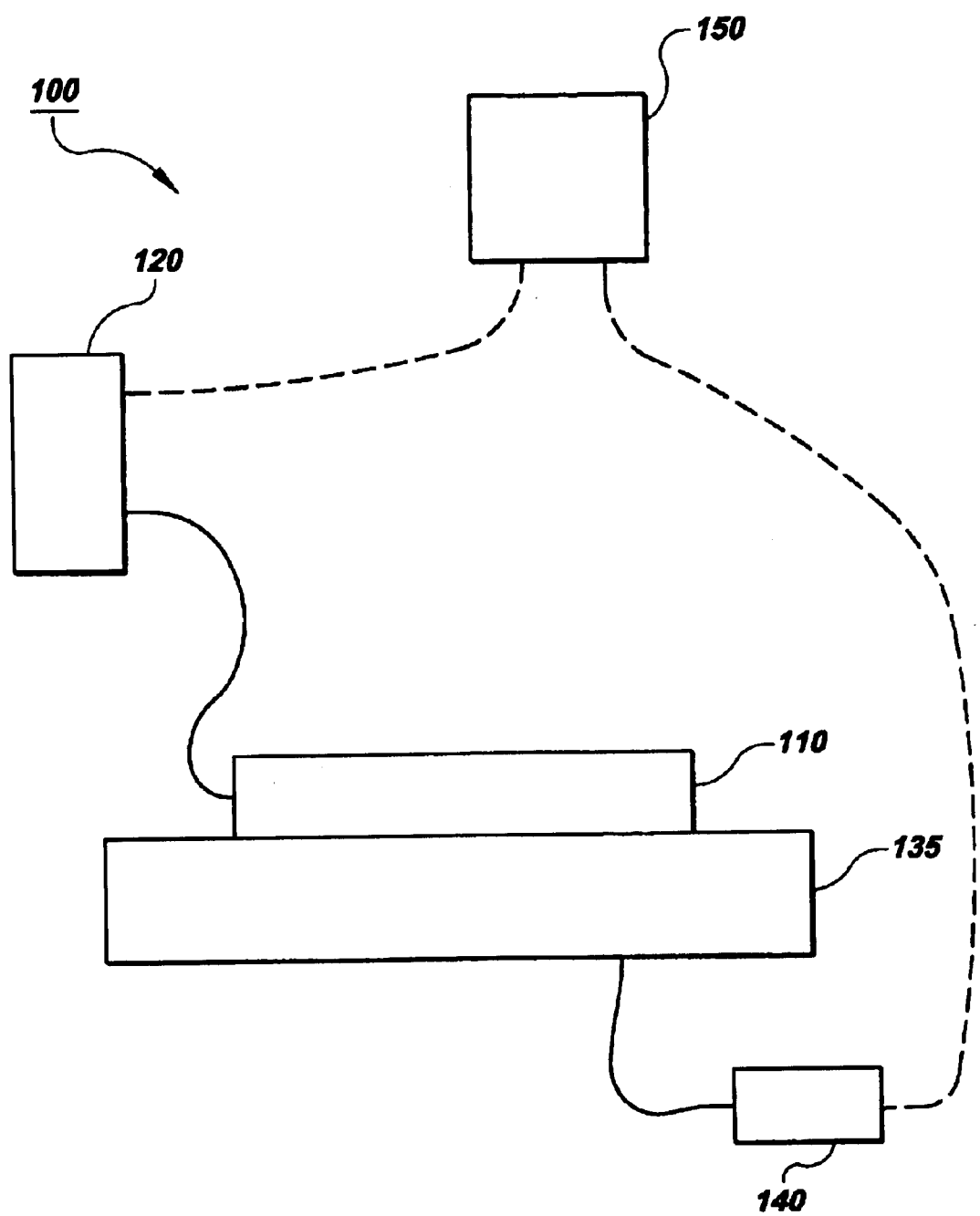
FIG. 1 shows a region-selective die heating system, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for an integrated circuit dice requiring or benefiting from analysis involving the selective application of heat to the die in order to locally heat a portion of circuitry in the die. While the present invention is not necessarily so limited, aspects of the invention may be appreciated through a discussion of various examples using this context.

According to an example embodiment of the present invention, a semiconductor die, such as a wire-bond or flip-chip type die, is manufactured having a plurality of heating elements formed therein. The heating elements are arranged in the device in a manner that facilitates selective heating of the die for analysis. A controller is adapted to control heating elements to selectively heat one or more portions of the die adjacent the elements while the die is being operated. The heat and operation of the die are then used to analyze the die, such as by obtaining a response from the die indicating a failure when heated. Arranging the heating elements within the die is particularly advantageous in that it makes possible selective heating of one or more portions of circuitry in an efficient and easy to use manner, and can be performed while the die is still in the wafer. Isolation of defects and design flaws is enhanced, improving the ability to design and analyze semiconductor dice.

In a more particular example embodiment of the present invention, the die is connected to an integrated circuit tester that applies a test pattern to the die. The heating elements are selectively activated while the test pattern is being applied, and the die is monitored for any defective operation that would indicate a die malfunction. When defective operation is detected, the corresponding portion of the die being heated is identified as a portion having a suspected defect. Once a portion of the die containing a defect is identified, the die is probed to provide additional defect information.

In another example embodiment of the present invention, the heater elements are designed and operated in a manner that loads power supplied to the region of the die surrounding the heater element. When operated, each heater element draws power, thereby reducing the power available for local circuit elements and slowing the operation of the local circuitry. The power-loading characteristic of the heater elements works in combination with the heat generation to slow the operation of circuitry. When the circuitry being slowed is part of a critical timing path, a malfunction occurs when the speed is sufficiently slowed. The portion of the die undergoing a power load when the malfunction is detected is identified as a portion having a critical timing path.

Various types of defects, such as resistive vias, timing-related defects, defective transistors, short or open circuits and other circuit defects are detectable using the heating arrangement. In the case of detecting timing defects, circuit paths in the die that fail upon operation at high speed or under heat application are often known in view of the design layout. These critical timing paths tend to fail before other portions of the die. The selective addition of heat to the die is used to cause a selected critical timing path to heat, and the increased heat makes the critical timing path more susceptible to failure. When a failure occurs while a particular critical timing path is heated, that failure is an indication that the heated path contains a defect or an improperly designed component of the circuit that fails at higher temperatures. Further analysis is then performed on circuit elements in the critical timing path to better identify the cause of the malfunction.

The integrated circuit tester is adapted to provide multiple test patterns to the die. The test patterns are selected to cause the die to operate in a manner useful for testing purposes. For example, the die can be operated with a normal operation pattern, a preset test pattern, under a high-stress operating condition, or under a test pattern that selectively causes regions of the die to operate. Selectively operating regions of the die is particularly useful for isolating the critical timing paths discussed hereinabove. Input signals to the die cause circuit elements in a selected critical timing path to operate. Heat is applied to the circuit elements and any defective response is detected and used to identify that one of the circuit elements is suspected of being defective.

In another example embodiment of the present invention, the heating elements are formed in a heating grid. The elements may include, for example, one or more of the following: a transistor, diode, resistive metal trace, polysilicon trace, and a doped substrate area. Such a heating element may include a circuit arrangement having a plurality of semiconductor devices. Each element is coupled to a power supply via interconnects in the die. When selectively powered, each element generates heat that is used to heat a corresponding portion of the semiconductor die in which the heating element is located.

FIG. 1 is a heating system adapted to analyze a semiconductor die, according to another example embodiment of the present invention. A semiconductor die 110 is positioned on a stage 135 and is coupled via the stage to a testing device 140 adapted to generate test signals for the die. Commonly-available testing devices, such as the Teradyne J971, are suitable for stimulating the die. The die includes a plurality of heater elements adapted to generate heat in response to being powered. A controller 120 is communicatively coupled to the heating elements in the die 110 and provides a control signal that causes one or more selected heating elements to operate. Optionally, the controller 120 and the testing device 140 are included in a single device. The die is operated via the testing device, and a response to the combined heat and operation is detected. The response may, for example, be detected using the testing device itself, or other common laboratory detection devices (e.g., analytical equipment such as an electron beam or laser beam probing system) may be implemented in replacement thereof or in addition thereto. The detected response is then used to analyze the die. Optionally, a computer device 150 is coupled to the controller 120 and/or the testing device 150, and is used to communicate control, response or other data. Response data is provided via the computer for user review.

Once a malfunction in the die has been detected, a portion of the die that is defective or otherwise flawed is identified. One example manner in which to identify a defect is to obtain an image of the defective portion of the die, such as a cross-sectional image, and examine the image to identify a particular circuit element that is defective. Another manner is to correlate the location of the heater element causing the defect with a known circuit layout and identify the defective portion of the die therefrom. In another implementation, the computer arrangement is adapted to use the detected response to perform the die analysis, such as by storing or manipulating the response, or by displaying information depicting the particular heater element being operated in order to isolate a critical timing path. The stored or displayed information can then be compared to empirical data, such as for a properly-functioning die, and variances in the comparison indicate a malfunction.

Figure 2:
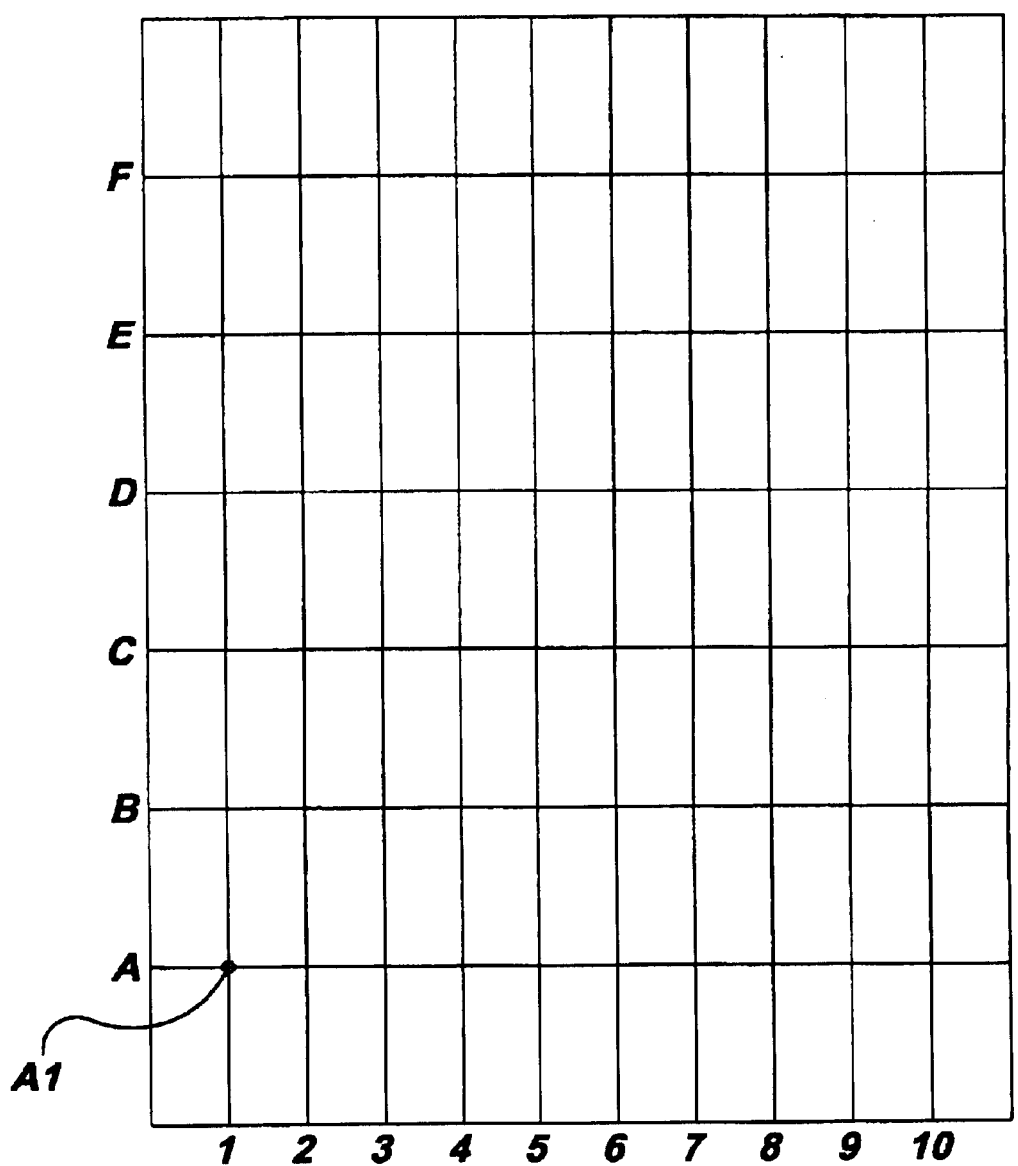
FIG. 2 shows an example grid arrangement for use in a region-selective die heating system, according to another example embodiment of the present invention.

FIG. 2 shows an example grid arrangement of heater elements, according to another example embodiment of the present invention. The grid may, for example, be implemented in connection with the die 110 of FIG. 1. Each intersection of the grid has a heating element. The elements are referred to by their row (capital letters) and column (numbers) identifications. For example, the element A1 at the circled intersection is identified as such because it is in row A, column 1. The grid elements may include various heat-generating circuitry, such as those elements mentioned hereinabove. In addition, the heater elements can be operated individually, together, in patterns or in virtually any manner consistent with the various applications of the present invention.

In another example embodiment of the present invention, a feedback loop is coupled to one or more of the heating elements. The feedback loop is used to control the action of the heating element. As the temperature changes, the loop is used to provide an indication of the change. This indication is used to detect various aspects of the heat application, such as the temperature, a change in the temperature and a rate of change (increase or decrease) in the temperature. Using the indication supplied by the feedback, the heat application is optimized to meet a desired response. Optimization includes maintaining parameters such as a selected temperature, a selected rate of increase or reduction of heat application and a selected heat differential from one area to another. In addition, the feedback can be used to detect the amount of heat spreading to surrounding circuitry, and the accuracy of the heat application can be detected therefrom.

In one implementation, the heating element is a transistor having a gate and controlled by way of an electrical bias provided to the gate. In this instance, the feedback loop includes a temperature sensor, such as a temperature sensitive diode, temperature sensitive transistor or a thermocouple. The temperature sensor is coupled to the gate and, as the temperature changes, the sensor applies a bias to the gate that is related to the temperature change. This bias in turn affects the amount of current flowing through the transistor, and thereby regulates the amount of heat generated by the operation of the transistor. For instance, as the temperature increases, the bias applied to the gate via the sensor causes the amount of current flowing through the transistor to decrease, and less heat is generated. Similarly, as the temperature decreases, the bias applied to the gate causes the amount of current flowing through the transistor to increase, and more heat is generated.

In another example embodiment, temperature feedback is used to control the region-selective heater. When the temperature exceeds a selected level, the heater is caused to generate less heat. This is accomplished in different manners, depending upon the application. In one implementation, the heater is operated at a selected operating speed. When the temperature feedback indicates that the amount of heat being supplied is too much, the operating speed is slowed. If more heat is needed, the operating speed is increased. The amount of power supplied to the heater can be altered to control the heat generation in a similar manner.

Monitoring the temperature can be implemented in various ways. In one embodiment, the voltage across an active (transistor) arrangement in a target or representative region in the die is measured at output ports of the heated die wherein a change in the voltage correlated change in temperature in the target region of the die. Depending on the sophistication of the heating chip, the temperature correlation is implemented separate from the heating arrangement, e.g., manually or using a computer or calculator, or is implemented using logic and translation devices (such as an analog-to-digital converter for converting the sensed voltage differential to a readable digital temperature code) internal to the die. Alternatively, the logic and translation devices can be piggy-backed onto the die and electrically connected to its output ports.

The heating elements may be operated in various fashions. In one example embodiment, a control register is formed in the die, and the control input to the elements is effected with the control register. The control register is adapted to selectively activate an individual heating element in the die. The selected element is used to generate heat and thereby heat nearby circuitry in the die. In another example embodiment, the die is adapted to receive signals from an external control. The external control is used to selectively activate one or more individual heating elements in the die, and is accomplished either using the control element or by directly activating the heating element. In one implementation, the control input includes a serial signal. Decoding and lookup blocks in the die interpret the signal and activate one or more heating elements based on the interpreted signal. In another implementation, the external control includes an activation grid that is electrically coupled to various heater elements in the die. Selected portions of the grid are activated and corresponding elements in the heater are powered, thereby generating heat. In still another implementation, the activation of the heater elements is pulsed and generates pulses of heat.

The grid operation characteristics are tailored differently to optimize particular testing applications. Various temperature selections and gradients can be used to effect selected tests. In one implementation, the control input is selected to operate various portions of the die in a sequence. For example, one element can be activated while the remaining elements are left inactive. This provides the ability to selectively heat a small portion of the die being analyzed. In another application, the elements of the die are heated in a selected sequence. Response data from the die is obtained and recorded relative to the sequence in which the heat is applied.

In another application, heat is applied to a group of elements at a time. A group consisting of adjacent heating elements is selected when it is desired to apply more heat than a single element can provide. This is particularly useful in combination with a feedback loop when a selected temperature is to be maintained. For example, referring to FIG. 2 and using the identification scheme discussed hereinabove, heating elements at locations B1–B4 and C1–C4 are powered, and the die begins to heat. If the heating rate is to be increased, additional heating elements at locations A1–A4 and D1–D4 are powered. If the heating rate is to be decreased, heating elements at locations B1–B2 and C1–C2 are shut off. In this manner, the amount of localized heating is readily controlled. Various other combinations are readily available based upon the desired results.

In still another application, and referring again to FIG. 2, the even-numbered elements at locations in rows A, C and E are selectively heated. Selecting elements that are distanced as such caused localized heating in various portions of the die at once, and the distance between the heated elements can be maintained such that heat from each element does not interfere with heat from another element. This is particularly useful, for example, for analyzing groups of critical paths to more efficiently identify defects and to speed the analysis process. If the entire group of critical paths withstand the application of heat via the grid, the heated elements are turned off, another group of elements is powered (e.g., the odd-numbered elements at locations in rows B, D and F), and the test is repeated. Once a defect has been found to exist corresponding to a critical timing path heated by the group of elements, further analysis is performed on portions of the die heated by the group of elements causing a defect.

While the present invention has been described with reference to several particular example embodiments, those skilled in the art will recognize that many changes may be made thereto without departing from the spirit and scope of the present invention, which is set forth in the following claims.

What is claimed is:

1. A method for manufacturing and analyzing a semiconductor die, the method comprising:

forming a plurality of heating elements in the die;

while operating the die, selectively controlling the heating elements and therein causing a subset of the heating elements to heat an adjacent portion of the die; and analyzing the die via the operation.

2. The method of claim 1, wherein the subset is less than all the heating elements, and selectively controlling the heating elements includes accessing a plurality of the heating elements to heat said adjacent portion of the die and wherein operating the die includes running a test pattern on a portion of the die suspected to cause a failure.

3. The method of claim 1, wherein operating the die includes electrically coupling the die to a signal generator adapted to supply test signals to the die.

4. The method of claim 1, where selectively controlling the heating elements includes accessing the subset of the heating elements to heat said adjacent portion of the die and further including detecting that the die is malfunctioning.

5. The method of claim 4, further comprising:
identifying the portion of the die being heated at the time that a malfunction is detected; and
correlating the portion of the die being heated to a critical timing path.

6. The method of claim 5, further comprising probing circuitry in the critical timing path and determining therefrom the nature of a defect.

7. The method of claim 1, wherein the die includes at least one of: a flip-chip bonded die and a wire-bonded die.

8. The method of claim 1, future comprising selectively controlling the heating elements and therein causing at least one of the heating elements to draw power in a manner that slows the operation of circuitry in at least one adjacent portion of the die.

9. The method of claim 1, further comprising electrically coupling the die to a package, wherein selectively controlling the heating elements includes applying an electrical signal to the heating elements via the electrical coupling to the package.

10. The method of claim 1, wherein selectively controlling the heating elements includes causing a portion of the die to heat to a selected temperature.

11. The method of claim 1, wherein selectively controlling the heating elements includes heating a plurality of the heating elements in a selected sequence.

12. The method of claim 1, wherein selectively controlling the heating elements includes causing at least two of the heating elements to generate heat, and wherein the at least two of the heating elements are located sufficiently distant from each other so that heat from one of the elements does not interfere with heat from another one of the elements in causing the die to heat.

13. The method of claim 1, wherein selectively controlling the heating elements includes causing the subset of the heating elements to generate pulses of heat.

14. A method for manufacturing and analyzing a semiconductor die, the method comprising:
forming a plurality of heating elements in the die;
while operating the die, selectively controlling the heating elements including
grouping the heating elements into selected groups, each group having two or more heating elements;
causing the selected groups to heat in a sequence;
detecting a response from the die that indicates that the die is operating defectively; and
in response to detecting the defective operation, identifying the selected group being caused to heat when the response is detected; and
selectively operating individual heating elements of the selected group and therein causing at least one of the heating elements to heat at least one adjacent portion of the die; and
analyzing the die via the operation.

15. The method of claim 1, wherein selectively controlling the heating elements comprises:
detecting a temperature characteristic related to the heated portion of the die; and
in response to the detected temperature characteristic, controlling the heating via a feedback loop.

16. The method of claim 15, further comprising forming a temperature sensor in the die, wherein detecting a temperature characteristic includes detecting the temperature of a portion of the die using the temperature sensor.

17. The method of claim 16, wherein forming a plurality of heating elements includes forming a transistor having a gate, and wherein forming the temperature sensor includes electrically coupling the temperature sensor to provide feedback to bias the gate, and therein regulate the current through the transistor and control the heat generated.

18. The method of claim 1, wherein selectively controlling the heating elements comprises:
electrically coupling the heating elements to a heat controller; and
supplying a signal from the controller to the heating elements and thereby controlling the heating elements.

19. The method of claim 1, further comprising forming a control register in the die, wherein selectively controlling the heating elements includes using the control register.

20. The method of claim 19, wherein selectively controlling the heating elements includes providing a serial signal to the control register and using decoding and lookup blocks at the control register to interpret the signal and activate one or more heating elements based on the interpreted signal.

21. The method of claim 1, wherein forming a plurality of heating elements in the die include forming a grid of heating elements.

22. A system for analyzing a semiconductor die having a plurality of heating elements formed therein, the system comprising:
control means for selectively causing a subset of the heating elements to generate heat and to heat a portion of the die therefrom;
operating means for operating the die; and
detection means for detecting a response from the die.

23. A system for analyzing a semiconductor die having a plurality of heating elements formed therein, the system comprising:
a controller adapted to selectively cause a subset of the heating elements to an heat adjacent portion of the die;
a testing device adapted to operate the die; and
a detector adapted to detect response from the die.

24. The system of claim 23, wherein the testing device and the controller are included in a single testing arrangement.

25. The system of claim 23, wherein each heating element includes at least one of: resistive metal, a transistor, a diode, doped metal and a polysilicon trace.

26. The system of claim 23, wherein the die further comprises a temperature sensor formed therein and adapted to provide temperature feedback, and wherein the controller is further communicatively coupled to receive the temperature feedback and to control the heating in response thereto.

27. The system of claim 23, further comprising a stage to hold the die and electrically couple the die to the testing device.

28. The system of claim 23, further comprising a computer communicatively coupled to the tester and adapted to control the tester.

29. The system of claim 28, wherein the computer is further communicatively coupled to the controller and adapted to direct the controller's operation.

30. The system of claim 23, wherein the detector and the testing device are included in a single arrangement.

31. The system of claim 30, further comprising a computer communicatively coupled to the controller, the testing device, and the detector, and wherein the computer is adapted to control the analysis of the die and to provide response results from analysis for review by a user.

* * * * *